US010866038B2

(12) United States Patent
Al Omari et al.

(10) Patent No.: US 10,866,038 B2
(45) Date of Patent: *Dec. 15, 2020

(54) HEAT SINKS WITH VIBRATION ENHANCED HEAT TRANSFER FOR NON-LIQUID HEAT SOURCES

(71) Applicant: UNITED ARAB EMIRATES UNIVERSITY, Al Ain (AE)

(72) Inventors: Salah Addin Burhan Al Omari, Al Ain (AE); Emad Elnajjar, Al Ain (AE)

(73) Assignee: UNITED ARAB EMIRATES UNIVERSITY, Al Ain (AE)

( * ) Notice: Subject to any disclaimer, the term of this patent is extended or adjusted under 35 U.S.C. 154(b) by 0 days.

This patent is subject to a terminal disclaimer.

(21) Appl. No.: 16/664,531

(22) Filed: Oct. 25, 2019

(65) Prior Publication Data
US 2020/0135614 A1    Apr. 30, 2020

Related U.S. Application Data

(60) Provisional application No. 62/750,796, filed on Oct. 25, 2018.

(51) Int. Cl.
F28F 13/10      (2006.01)
F28D 21/00     (2006.01)
(Continued)

(52) U.S. Cl.
CPC .............. F28F 13/10 (2013.01); F28D 21/00 (2013.01); H01L 23/427 (2013.01); H01L 23/433 (2013.01); F28D 2021/0029 (2013.01)

(58) Field of Classification Search
CPC ........... F28F 9/013; F28F 13/10; H01L 23/36; H01L 23/427; H01L 23/433; F28D 21/00
(Continued)

(56) References Cited

U.S. PATENT DOCUMENTS 5,046,365 A * 9/1991 Kumley ................... G01D 3/08
                                                        361/700
5,572,404 A * 11/1996 Layton .................. H01L 23/433
                                                        165/185
(Continued)

FOREIGN PATENT DOCUMENTS

CN          2438083 Y      7/2001
CN          2829313 Y      10/2006
(Continued)

OTHER PUBLICATIONS

Gao, Y. and Liu, J., "Gallium-based thermal interface material with high compliance and wettability." Applied Physics A 107(3): pp. 701-708 (2012).
(Continued)

*Primary Examiner* — Paul Alvare
(74) *Attorney, Agent, or Firm* — Nath, Goldberg & Meyer; Richard C. Litman

(57) ABSTRACT

The heat sinks with vibration enhanced heat transfer for non-liquid heat sources are heat sinks formed from a first body of high thermal conductivity material received within a thermally conductive housing such that at least one contact face of the first body of high thermal conductivity material is exposed, forming a direct contact interface with a heat source requiring cooling. The heat source requiring cooling may be any non-liquid heat source, including a processor chip, an integrated circuit chip, a modular circuit package, or the like. The thermally conductive housing may be disposed such that at least one contact face of the thermally conductive housing is in direct contact with the vibrating base. Alternatively, the vibrating base may be attached to a support attached to the heat source. The vibrating base applies oscillating waves to the heat sink, thereby increasing heat transfer between the heat source and the heat sink.

7 Claims, 5 Drawing Sheets

(51) Int. Cl.
*H01L 23/427* (2006.01)
*H01L 23/433* (2006.01)
(58) Field of Classification Search
USPC .................................................. 165/80.2, 178
See application file for complete search history.

(56) References Cited

U.S. PATENT DOCUMENTS

| | | | |
|---|---|---|---|
| 6,665,186 B1 | 12/2003 | Calmidi | |
| 6,708,501 B1* | 3/2004 | Ghoshal | ................ H01L 23/473 165/104.19 |
| 7,131,286 B2* | 11/2006 | Ghoshal | ................ H01L 23/473 62/259.2 |
| 7,176,564 B2* | 2/2007 | Kim | ...................... H01L 23/367 257/714 |
| 8,891,567 B2* | 11/2014 | Herden | ................... H01L 23/26 372/33 |
| 9,000,473 B2 | 4/2015 | Lee | |
| 10,043,732 B1 | 8/2018 | Al Omari | |
| 2002/0033247 A1 | 3/2002 | Neuschütz | |
| 2005/0093140 A1* | 5/2005 | Kim | ...................... H05K 7/2099 257/714 |
| 2005/0228097 A1 | 10/2005 | Zhong | |
| 2006/0238984 A1* | 10/2006 | Belady | .................. H01L 23/367 361/704 |
| 2007/0058346 A1* | 3/2007 | Yeh | ......................... G06F 1/203 361/697 |
| 2007/0238219 A1* | 10/2007 | Bennett | ................... H01S 3/042 438/106 |
| 2008/0003649 A1* | 1/2008 | Maltezos | ............. G01N 21/645 435/91.2 |
| 2008/0041565 A1 | 2/2008 | Yang | |
| 2008/0101073 A1 | 5/2008 | Hayman | |
| 2009/0262500 A1* | 10/2009 | Makino | ............... H01L 23/4735 361/697 |
| 2010/0170657 A1* | 7/2010 | Kaslusky | ................ F28F 13/10 165/80.3 |
| 2011/0083436 A1* | 4/2011 | White | ................... F28D 20/025 60/670 |
| 2011/0259549 A1* | 10/2011 | Luo | ........................ H01L 23/467 165/84 |
| 2014/0166232 A1* | 6/2014 | Al-Hallaj | ................ F24T 10/15 165/11.1 |
| 2015/0033764 A1 | 2/2015 | Klein | |
| 2015/0204612 A1 | 6/2015 | Sun | |
| 2015/0285564 A1 | 10/2015 | Wood | |
| 2016/0212878 A1 | 7/2016 | Quinn | |

FOREIGN PATENT DOCUMENTS

| | | | |
|---|---|---|---|
| CN | 101775270 A | | 7/2010 |
| CN | 103759563 A | | 4/2014 |
| CN | 104344289 A | | 2/2015 |
| JP | 02094546 A | * | 4/1990 |
| JP | 10122787 A | * | 5/1998 |
| JP | 2001028418 A | * | 1/2001 |
| JP | 2008210875 A | | 9/2008 |
| JP | 2008210876 A | | 9/2008 |
| JP | 2014222708 A | * | 11/2014 |
| KR | 20030029071 A | | 4/2003 |
| KR | 20130037868 A | | 4/2013 |
| KR | 20130125060 A | | 11/2013 |

OTHER PUBLICATIONS

Song, S., et al., "Experimental study on laminar convective heat transfer of microencapsulated phase change material slurry using liquid metal with low melting point as carrying fluid." International Journal of Heat and Mass Transfer 73: pp. 21-28 (2014).

Zaghdoudi, M. C., "Use Of Heat Pipe Cooling Systems In The Electronics Industry," Electronics Cooling, (Nov. 1, 2004).

Ghazal, M. S. A., "Experimental Investigations of Techniques to Enhance the Cooling Rate of Hot Fluids By Utilizing Gallium as a Heat Sink Material," Mechanical Engineering Theses 2, United Arab Emirates University (Nov. 2017).

* cited by examiner

HEAT SINKS WITH VIBRATION ENHANCED HEAT TRANSFER FOR NON-LIQUID HEAT SOURCES

CROSS-REFERENCE TO RELATED APPLICATION

This application claims the benefit of U.S. Provisional Patent Application Ser. No. 62/750,796, filed Oct. 25, 2018.

BACKGROUND

1. Field

The disclosure of the present patent application relates to heat sinks, and particularly to a heat sink with vibration enhanced heat transfer for cooling a non-liquid heat source.

2. Description of the Related Art

As electronic technology continues to advance, electronic components, such as processor chips, are being made to provide faster operational speeds and greater functional capabilities. When a typical processor chip or a similar integrated circuit or modular circuit package operates at a high speed inside a computer or device housing, its temperature increases at a rapid rate. It is therefore necessary to dissipate the generated heat before any damage to the system may occur.

Conventionally, a heat sink is used to dissipate heat generated by a processor or the like. A conventional heat sink includes a base, which makes direct contact with the heat source, and a plurality of cooling fins. The heat sink dissipates heat by conduction through the base and into the fins, followed by convective cooling of the fins. However, as the power of electronic devices increases, so does the heat generated by their internal components, thus requiring heat sinks that are capable of dissipating heat far more effectively. For this reason, phase change material-type heat sinks have gradually begun to replace conventional heat sinks.

A typical phase change material-type heat sink has an evacuated cavity with a volume of working fluid sealed within the cavity. The phase change material-type heat sink transfers heat via phase transition of the working fluid. Thus, the phase change material-type heat sink has good heat conductivity and can quickly transfer heat from one place to another place. A typical phase change material heat sink may include a hermetically sealed container with a volume of water enclosed therein. The container is typically vacuum-exhausted, thus enhancing the evaporative effect of the water. The container includes a base for contacting the heat source, and a cover facing the base, typically with a plurality of cooling fins attached thereto. In use, heat produced by the heat source is conducted to the base, and this heat evaporates the water. The water vapor flows toward the cover and dissipates the heat thereto. This heat exchange condenses the water back into the liquid phase, which falls back toward the base, under the force of gravity, to continue the cycle. The heat transferred to the cover is radiated by the fins to the surrounding air.

Vibration has also been used to enhance certain characteristics of conventional heat sinks and heat spreaders. For example, an LED module including a heat sink with a vibrating fin has been taught to improve cooling performance. Conventionally, a heat spreader is generally used to rapidly disperse heat across an area, and may be used in combination with a heat sink. A heat spreader including a liquid filled internal space between two thin films and a vibration means for vibrating the liquid have been taught to improve heat spread performance.

Although such phase change material-type heat sinks and/or vibration enhanced heat sinks/spreaders are more efficient than conventional heat sinks/spreaders, these heat sinks/spreaders are still limited in their effectiveness. A typical water-based phase change material-type heat sink, as described above, is limited in its effectiveness primarily due to design considerations, such as thermal conductivity and heat capacity of the materials involved as functions of the physical dimensions of the heat sink. The heat sinks/spreaders incorporating vibration are also limited by design considerations, specifically in that the vibration is applied to cooling fins or to increase the rate at which the heat is dispersed in a liquid reservoir. Thus, heat sinks with vibration enhanced heat transfer solving the aforementioned problems are desired.

SUMMARY

In one embodiment, the present subject matter is directed to a heat sink with a vibrating base. In this embodiment, the heat sink is formed from a first body of high thermal conductivity material. The first body of high thermal conductivity material is received within a thermally conductive housing such that at least one contact face of the first body of high thermal conductivity material is exposed, forming a direct contact interface with a heat source requiring cooling. The heat source requiring cooling may be any non-liquid heat source, including but not limited to a processor chip. The thermally conductive housing has at least one wall and is disposed such that at least one contact face of the thermally conductive housing is in direct contact with the vibrating base.

In an embodiment, the first body of high thermal conductivity material may comprise a liquid high thermal conductivity material. In an alternative embodiment, the first body of high thermal conductivity material may comprise a body of solid phase change material. In this alternative embodiment, the thermally conductive housing may also have at least one sensor attached to said at least one wall and positioned to detect melting of the first body of high thermal conductivity material at the direct contact interface.

In use, heat generated by the heat source is transferred, via conduction, into the first body of high thermal conductivity material. The heat from the heat source may cause at least a portion of the first body of high thermal conductivity material, if solid, to at least partially liquefy, forming a conductive melted high thermal conductivity material layer within the first body of high thermal conductivity material and disposed in direct contact with the heat source.

The first body of high thermal conductivity material will thus absorb and store latent heat until it can be transferred by convection through the thermally conductive housing and be dissipated into the surrounding environment. The vibrating base may apply oscillating waves, propagating through the thermally conductive housing and/or the first body of high thermal conductivity material, to reach the direct contact interface and thereby increasing heat transfer between the heat source and the first body of high thermal conductivity material, and/or between the heat source and the conductive melted high thermal conductivity material layer, and/or between the conductive melted high thermal conductivity material layer and the rest of the first body of high thermal conductivity material. At the direct contact interface, the vibration may generate active dynamic motions of the molecules of the first body of high thermal conductivity material or the conductive melted high thermal conductivity material layer, thereby increasing the rate of heat transfer from the heat source to the heat sink.

In an alternative embodiment, the present subject matter is directed to a heat sink with a vibrating base. In this embodiment, the heat sink is formed from a first body of high thermal conductivity material. The first body of high thermal conductivity material is received within a thermally conductive housing such that at least one contact face of the first body of high thermal conductivity material is exposed, forming a direct contact interface with a heat source requiring cooling. The heat source requiring cooling may be any non-liquid heat source, including but not limited to a processor chip. The heat source is attached to at least one support, which is adapted to be in direct contact with at least one vibrating base. In this embodiment, the vibrating base may apply oscillating waves, propagating through the at least one support and the heat source to reach the first body of high thermal conductivity material and the direct contact interface, thereby increasing heat transfer between the heat source and the first body of high thermal conductivity material, and/or between the heat source and the conductive melted high thermal conductivity material layer, and/or between the conductive melted high thermal conductivity material layer and the rest of the first body of high thermal conductivity material. At the direct contact interface, the vibration may generate active dynamic motions of the molecules of the first body of high thermal conductivity material or the conductive melted high thermal conductivity material layer, thereby increasing the rate of heat transfer from the heat source to the heat sink. The vibrating base will not vibrate unless a sufficient quantity of the first body of high thermal conductivity material surrounding the heat source is liquid, to protect the heat source from being damaged by the resulting vibrations.

These and other features of the present disclosure will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
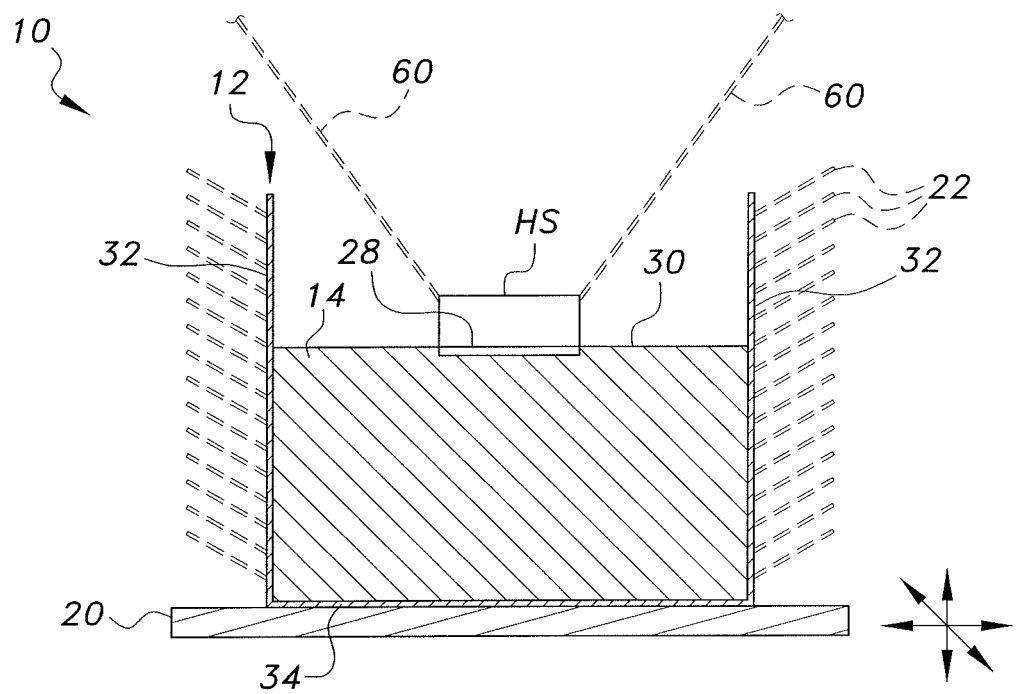
FIG. 1A is a side view in section of a heat sink with vibration enhanced heat transfer for non-liquid heat sources.

The heat sink with vibration enhanced heat transfer for non-liquid heat sources is formed from a first body of high thermal conductivity material. The first body of high thermal conductivity material is received within a thermally conductive housing such that at least one contact face of the first body of high thermal conductivity material is exposed, forming a direct contact interface with a heat source requiring cooling. In an embodiment, the heat source requiring cooling may be any non-liquid heat source, including but not limited to a processor chip. The thermally conductive housing has at least one wall and is disposed such that at least one contact face of the thermally conductive housing is in direct contact with the vibrating base. The high thermal conductivity material may be a liquid material or a solid material at room temperature. Thus, part or all of the first body of high thermal conductivity material may be liquefied prior to exposing the heat sink to the heat source. The at least one wall of the thermally conductive housing may have a plurality of fins mounted to at least a portion thereof, outside of the first body of high thermal conductivity material. The individual fins forming the plurality of fins may have any orientation, may be straight or branched, may be solid or hollow, and/or may have any combination of these features.

As used herein, the term "approximately" when used to modify a numerical value means within 10% of said numerical value.

In use, heat generated by the heat source is transferred, via conduction, into the first body of high thermal conductivity material. The heat from the heat source may cause at least a portion of the first body of high thermal conductivity material, if solid, to at least partially liquefy, forming a conductive melted high thermal conductivity material layer within the first body of high thermal conductivity material and disposed in direct contact with the heat source. The conductive melted high thermal conductivity material layer may act as a liquid with a high thermal conductivity, thereby supporting heat transfer from the heat source to the conductive melted high thermal conductivity material layer and subsequently to the rest of the first body of high thermal conductivity material. The conductive melted high thermal conductivity material layer may transfer heat between the heat source and the first body of high thermal conductivity material and/or the thermally conductive housing by conduction or convection. The first body of high thermal conductivity material will thus absorb and store latent heat until it can be transferred by convection through the thermally conductive housing and be dissipated into the surrounding environment.

The vibrating base may apply oscillating waves, propagating through the thermally conductive housing and/or the first body of high thermal conductivity material, to reach the direct contact interface between the first body of high thermal conductivity material and the heat source requiring cooling, thereby increasing heat transfer between the heat source and the first body of high thermal conductivity material, and/or between the heat source and the conductive melted high thermal conductivity material layer, and/or between the conductive melted high thermal conductivity material layer and the rest of the first body of high thermal conductivity material. The oscillating waves can be any kind of wave, including for example sinusoidal waves or square waves. The oscillating waves may be applied laterally, vertically, or in any other direction, the oscillating waves may be applied continuously or intermittently. The oscillating waves may be applied when a need to dump heat from the heat source is detected, or upon detecting a need to dump more heat or dump heat at a faster rate from the heat source. The oscillating waves may be generated by any known means, including but not limited to mechanical means, ultrasound, and electrical or magnetic effects.

The heat source may be a solid body, including but not limited to a processor chip, an integrated circuit chip, a modular circuit package, or the like. If the heat source is a solid body, it may be desirable to avoid applying the vibrations directly to the heat source. The vibrations may be applied directly to the heat sink and propagated through the first body of high thermal conductivity material, to avoid direct application to the heat source.

In an embodiment, the thermally conductive housing may also have at least one sensor attached to the at least one wall of the thermally conductive housing and the at least one sensor may be positioned to detect melting of the first body of high thermal conductivity material, if solid, at the direct contact interface. In this embodiment, the at least one sensor may communicate with the vibrating base, such that the vibrating base does not apply oscillating waves until the sensor detects melting of a sufficient quantity of the first body of high thermal conductivity material to protect the heat source from being damaged by the resulting vibrations.

At the direct contact interface, the oscillating waves (vibrations) may generate active dynamic motions of the molecules of the first body of high thermal conductivity material and/or the conductive melted high thermal conductivity material layer, thereby increasing the rate of heat transfer from the heat source to the heat sink. Again, the vibrating base will not vibrate unless a sufficient quantity of the first body of high thermal conductivity material surrounding the heat source is liquid, to protect the heat source from being damaged by the resulting vibrations.

In an alternative embodiment, the present subject matter is directed to a heat sink with a vibrating base. In this embodiment, the heat sink is formed from a first body of high thermal conductivity material. The first body of high thermal conductivity material is received within a thermally conductive housing such that at least one contact face of the first body of high thermal conductivity material is exposed, forming a direct contact interface with a heat source requiring cooling. The heat source requiring cooling may be any non-liquid heat source, including but not limited to a processor chip. The heat source is attached to at least one support and said at least one support is adapted to be in direct contact with at least one vibrating base. In this embodiment, the at least one vibrating base may apply oscillating waves, propagating through the at least one support and the heat source to reach the first body of high thermal conductivity material and the direct contact interface, thereby increasing heat transfer between the heat source and the first body of high thermal conductivity material, and/or between the heat source and the conductive melted high thermal conductivity material layer, and/or between the conductive melted high thermal conductivity material layer and the rest of the first body of high thermal conductivity material. At the direct contact interface, the vibration may generate active dynamic motions of the molecules of the first body of high thermal conductivity material or the conductive melted high thermal conductivity material layer, thereby increasing the rate of heat transfer from the heat source to the heat sink. Again, the at least one vibrating base will not vibrate unless a sufficient quantity of the first body of high thermal conductivity material surrounding the heat source is liquid, to protect the heat source from being damaged by the resulting vibrations.

Figure 1B:
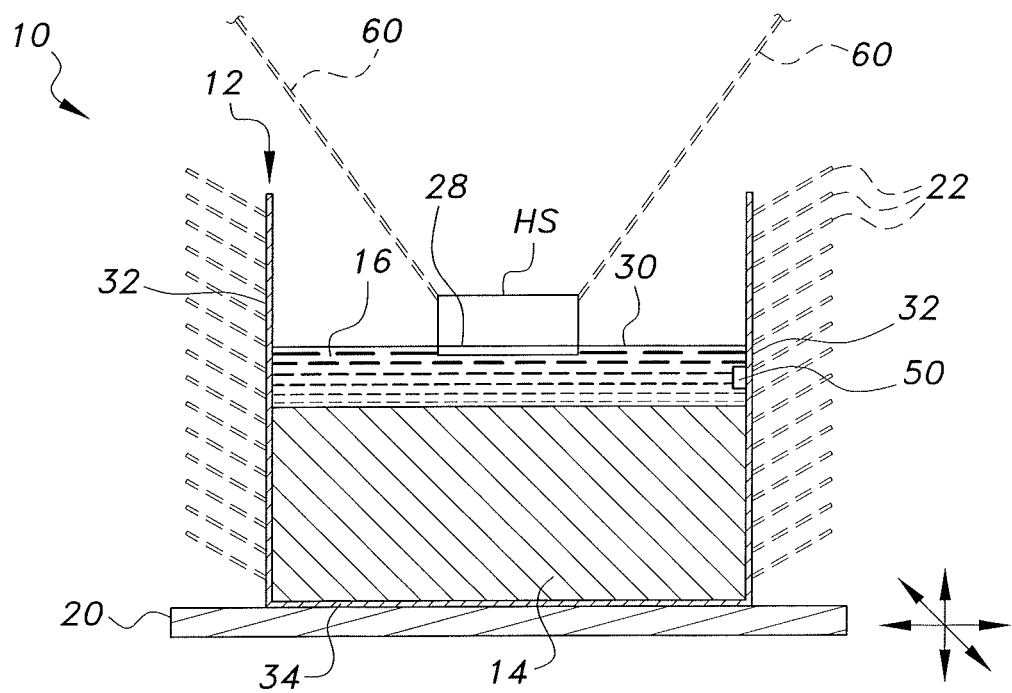
FIG. 1B is a side view in section of a heat sink with vibration enhanced heat transfer for non-liquid heat sources having a conductive melted high thermal conductivity material layer.

Referring to the embodiment of FIGS. 1A and 1B, the heat sink with vibration enhanced heat transfer, designated generally as 10, is a heat sink formed from a first body of high thermal conductivity material 14 disposed within a thermally conductive housing 12 such that at least one contact face 30 of the first body of high thermal conductivity material 14 is exposed, forming a direct contact interface 28 with at least one face of at least one heat source HS that requires cooling. The thermally conductive housing 12 has at least one wall 32 and at least one contact face 34, and said contact face 34 of said thermally conductive housing 12 is adapted to be in direct contact with a vibrating base 20. In this embodiment, the at least one heat source HS may be any solid component that requires cooling. In some embodiments, the component that requires cooling can be a processor chip, an integrated circuit chip, a modular circuit package or the like. In this embodiment, the heat source HS may be physically attached to one or more supports 60. In some embodiments, the one or more supports 60 may be attached to at least one of the at least one wall 32, or the vibrating base 20 (not shown). In other embodiments, the one or more supports 60 may avoid any direct contact with the at least one wall 32, or the vibrating base 20 (as shown in FIGS. 1A and 1B). It should be further understood that the overall configuration and relative dimensions of the thermally conductive housing 12, the first body of high thermal conductivity material 14, the vibrating base 20, and the one or more supports 60 are shown for purposes of illustration only.

The thermally conductive housing 12 may be selected from any suitable material that is compatible with the selected first body of high thermal conductivity material 14. For example, aluminum would not be used as a thermally conductive housing 12 material when the first body of high thermal conductivity material 14 includes elemental gallium. The at least one wall 32 of the thermally conductive housing 12 may have a plurality of fins 22 mounted to at least a portion thereof, outside of the first body of high thermal conductivity material 14. It should be understood that the positioning, overall configuration, relative dimensions, and number of thermally conductive fins 22 are shown for exemplary purposes only.

The first body of high thermal conductivity material 14 may comprise at least one high thermal conductivity material that may be liquid at intended operating conditions, or it may be a solid phase change material. The at least one high thermal conductivity material is selected such that it has a high thermal conductivity and, if the high thermal conductivity material selected is a solid phase change material, is selected such that it has a melting point between the temperature of the external environment within which the heat sink 10 is intended to operate, and the maximum operating temperature of the heat source HS. If the at least one high thermal conductivity material selected for the first body of high thermal conductivity material 14 is a phase change material, it may further be selected to have a phase change temperature at the target temperature or within the target operating temperature range to which the heat source HS is intended to be cooled. As a non-limiting example, if a heat sink 10 is intended to operate in a room maintained at 20° C. and to cool a heat source with a maximum operating temperature of 60° C., elemental gallium having a melting point of approximately 30° C. might be selected for the first body of high thermal conductivity material 14. Non-limiting examples of suitable high thermal conductivity materials for the first body of high thermal conductivity material 14 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, pentadecanoic acid, liquid gallium, and nano-fluids with high thermal conductivity nanoparticles.

In use, heat generated by the heat source HS is transferred, via conduction, into the first body of high thermal conductivity material 14. In the embodiments where the high thermal conductivity material is a solid phase change material, this may result in melting of at least a portion of the first body of high thermal conductivity material 14, which absorbs some of the heat from the heat source and forms a conductive melted high thermal conductivity material layer 16 within the first body of high thermal conductivity material 14 and disposed in direct contact with the heat source HS (as shown in FIG. 1B). Therefore, the conductive melted high thermal conductivity material layer 16 is typically a partially liquid form of the first body of high thermal conductivity material 14. In embodiments where the high thermal conductivity material is a liquid, the first body of high thermal conductivity material 14 is immediately adjacent to the heat source HS (as shown in FIG. 1A).

The heat stored in the first body of high thermal conductivity material 14 and the heat stored in the conductive melted high thermal conductivity material layer 16, if present, may then be transferred by conduction and convection, respectively, to the thermally conductive housing 12. Heat transferred to the thermally conductive housing 12 may then be transferred by convection into the external environment, and by convection through the fins 22, if present, thereby cooling the heat sink 10. The vibrating base 20 may propagate oscillating waves through the thermally conductive housing 12, the first body of high thermal conductivity material 14, and/or the thermally conductive melted high thermal conductivity material layer 16, if present, to reach the direct contact interface 28, thereby increasing the rate of heat transfer from the heat source HS to the first body of high thermal conductivity material 14 and the conductive melted high thermal conductivity material layer 16, if present. Thus the heat from the heat source HS is quickly and efficiently transferred to the ambient environment.

In embodiments where the at least one high thermal conductivity material selected for the first body of high thermal conductivity material 14 is a solid phase change material, it may be desirable to avoid applying the oscillating waves until a sufficient portion of the first body of high thermal conductivity material 14 has melted. In this embodiment, the thermally conductive housing 12 may also have at least one sensor 50 attached to the at least one wall 32 of the thermally conductive housing 12 and the at least one sensor 50 may be positioned to detect melting of the first body of high thermal conductivity material 14 at the direct contact interface 28 (See FIG. 1B). In this embodiment, the at least one sensor 50 may communicate with the vibrating base 20, such that the vibrating base 20 does not apply oscillating waves until the at least one sensor 50 detects melting of a sufficient quantity of the first body of high thermal conductivity material 14 to protect the heat source HS from being damaged by the resulting vibrations. For the avoidance of doubt, in all embodiments the vibrating base 20 will not vibrate unless a sufficient quantity of the first body of high thermal conductivity material 14 surrounding the heat source HS is liquid, to protect the heat source HS from being damaged by the resulting vibrations.

Figure 2A:
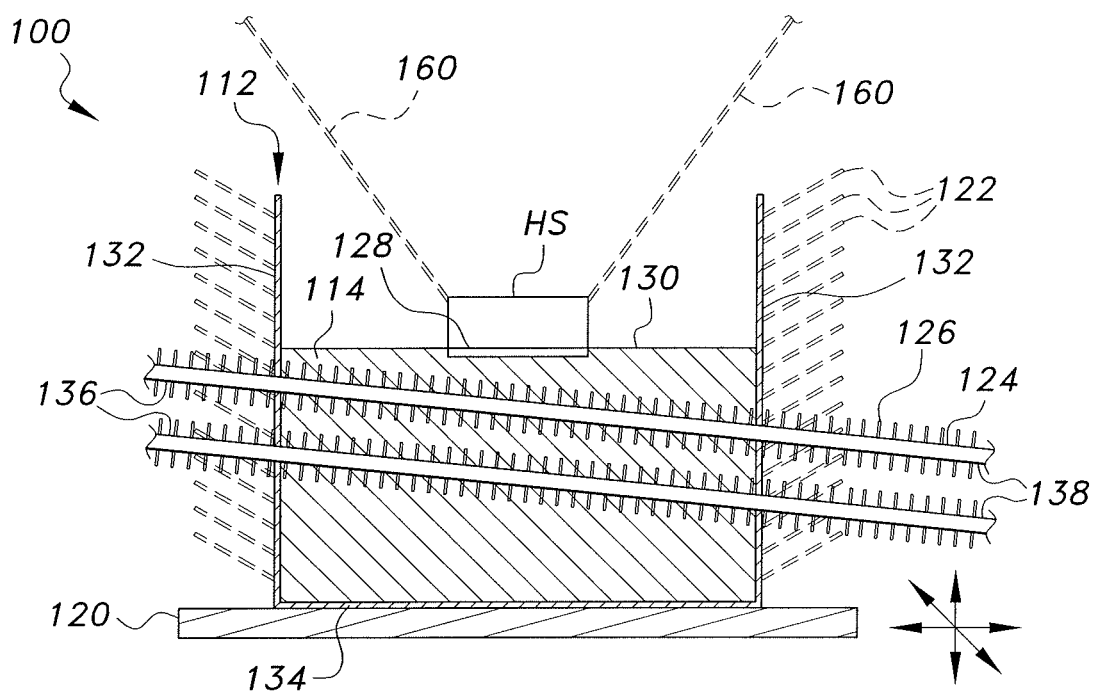
FIG. 2A is a side view in section of an alternative embodiment of a heat sink with vibration enhanced heat transfer for non-liquid heat sources having at least one tube.
Figure 2B:
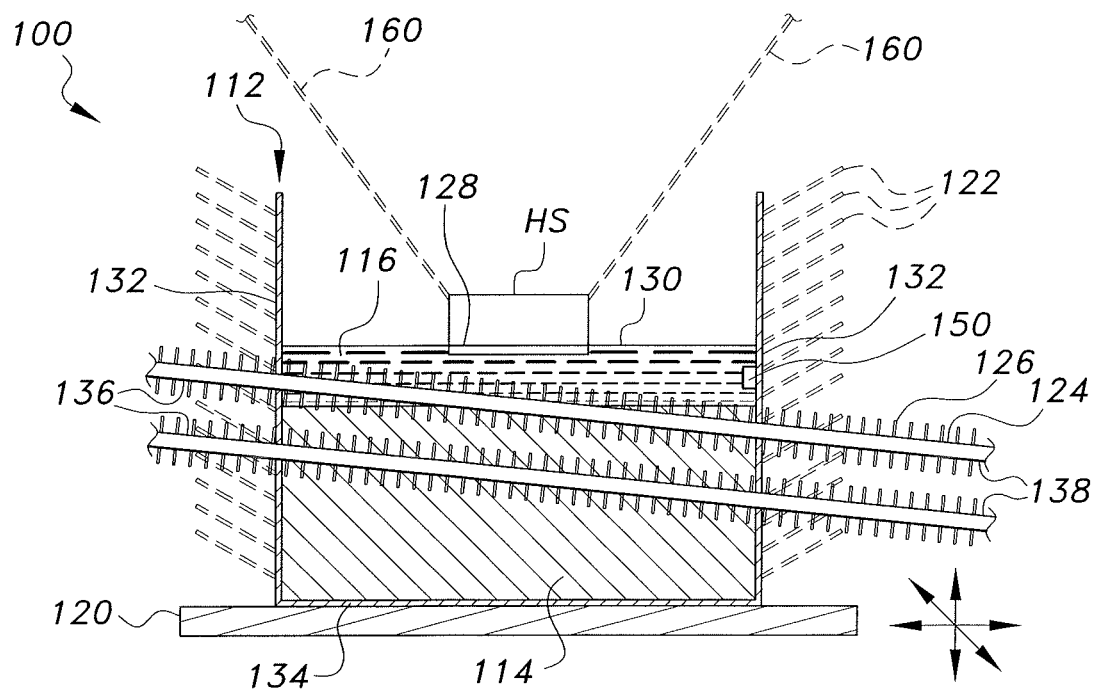
FIG. 2B is a side view in section of an alternative embodiment of a heat sink with vibration enhanced heat transfer for non-liquid heat sources having at least one tube and a conductive melted high thermal conductivity material layer.

In the alternative embodiment of FIGS. 2A and 2B, the heat sink with vibration enhanced heat transfer, designated generally as 100, is also a heat sink formed from a first body of high thermal conductivity material 114 disposed within a thermally conductive housing 112 such that at least one contact face 130 of the first body of high thermal conductivity material 114 is exposed, forming a direct contact interface 128 with at least one face of at least one heat source HS that requires cooling. The thermally conductive housing 112 again has at least one wall 132 and at least one contact face 134, and said contact face 134 of said thermally conductive housing 112 is adapted to be in direct contact with a vibrating base 120. As in the previous embodiment, the at least one heat source HS may be any solid component that requires cooling. In some embodiments, the component that requires cooling can be a processor chip, an integrated circuit chip, a modular circuit package or the like. In this embodiment, the heat source HS may be physically attached to one or more supports 160. In some embodiments, the one or more supports 160 may be attached to at least one of the at least one wall 132, or the vibrating base 120 (not shown). In other embodiments, the one or more supports 160 may avoid any direct contact with the at least one wall 132, or the vibrating base 120 (as shown in FIGS. 2A and 2B). As in the previous embodiment, it should be further understood that the overall configuration and relative dimensions of the thermally conductive housing 112, the first body of high thermal conductivity material 114, the vibrating base 120, and the one or more supports 160 are shown for purposes of illustration only.

The thermally conductive housing 112 may be selected from any suitable material that is compatible with the selected first body of high thermal conductivity material 114. For example, aluminum would not be used as a thermally conductive housing 112 material when the first body of high thermal conductivity material 114 includes elemental gallium. The at least one wall 132 of the thermally conductive housing 112 may have a plurality of fins 122 mounted to at least a portion thereof, outside of the first body of high thermal conductivity material 114. It should be understood that the positioning, overall configuration, relative dimensions, and number of thermally conductive fins 122 are shown for exemplary purposes only.

The first body of high thermal conductivity material 114 may comprise at least one high thermal conductivity material that may be liquid at intended operating conditions, or it may be a solid phase change material. The at least one high thermal conductivity material is selected such that it has a high thermal conductivity, and, if the high thermal conductivity material selected is a solid phase change material, is selected such that it has a melting point between the temperature of the external environment within which the heat sink 100 is intended to operate and the maximum operating temperature of the heat source HS. If the at least one high thermal conductivity material selected for the first body of high thermal conductivity material 114 is a phase change material, it may further be selected to have a phase change temperature at the target temperature or within the target operating temperature range to which the heat source HS is intended to be cooled. As a non-limiting example, if a heat sink 100 is intended to operate in a room maintained at 20° C. and to cool a heat source with a maximum operating temperature of 60° C., elemental gallium having a melting point of approximately 30° C. might be selected for the first body of high thermal conductivity material 114. Non-limiting examples of suitable high thermal conductivity materials for the first body of high thermal conductivity material 114 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, pentadecanoic acid, liquid gallium, and nano-fluids with high thermal conductivity nanoparticles.

In use, heat generated by the heat source HS is transferred, via conduction, into the first body of high thermal conductivity material 114. In embodiments where the high thermal conductivity material is a solid phase change material, this may result in melting of at least a portion of the first body of high thermal conductivity material 114, which absorbs some of the heat from the heat source HS and forms a conductive melted high thermal conductivity material layer 116 within the first body of high thermal conductivity material 114 and disposed in direct contact with the heat source HS (as shown in FIG. 2B). Therefore, the conductive melted high thermal conductivity material layer 116 is typically an at least partially liquid form of the first body of high thermal conductivity material 114. In embodiments where the high thermal conductivity material is a liquid, the first body of high thermal conductivity material 114 is immediately adjacent to the heat source HS (as shown in FIG. 2A).

The heat stored in the first body of high thermal conductivity material 114 and the heat stored in the conductive melted high thermal conductivity material layer 116, if present, may then be transferred by conduction and convection, respectively, to the thermally conductive housing 112. Heat transferred to the thermally conductive housing 112 may then be transferred by convection into the external environment, and by convection through the fins 122, if present, thereby cooling the heat sink 100. The vibrating base 120 may propagate oscillating waves through the thermally conductive housing 112, the first body of high thermal conductivity material 114, and/or the thermally conductive melted high thermal conductivity material layer 116, if present, to reach the direct contact interface 128, thereby increasing the rate of heat transfer from the heat source HS to the first body of high thermal conductivity material 114 and the conductive melted high thermal conductivity material layer 116, if present. Thus the heat from the heat source HS is quickly and efficiently transferred to the ambient environment.

In the alternative embodiment of FIGS. 2A and 2B, a plurality of tubes 124 is provided. In the example of FIGS. 2A and 2B, two such tubes 124 are shown, each having a first end 136 and an opposed second end 138; however, it should be understood that any number of tubes 124 may be used. Each of the plurality of tubes 124 is positioned in and traverses the first body of high thermal conductivity material 114 and the thermally conductive housing 112, such that the first end 136 and the second end 138 of each of the plurality of tubes 124 is positioned outside of the first body of high thermal conductivity material 114 and the thermally conductive housing 112. As shown in FIG. 2B, one or more of the plurality of tubes 124 may also traverse at least a portion of the conductive melted high thermal conductivity material layer 116. In an embodiment, the first end 136 and the second end 138 of one or more of the plurality of tubes 124 are closed. In an alternative embodiment, the first end 136 and the second end 138 of one or more of the plurality of tubes 124 are in open fluid communication with the external environment. Each of the plurality of tubes 124 may have a plurality of thermally conductive fins 126 mounted on at least a portion thereof inside and/or outside the first body of high thermal conductivity material 114, the conductive melted high thermal conductivity material layer 116, and the thermally conductive housing 112. The plurality of tubes 124 may further improve the rate at which the heat sink 100 transfers heat from the heat source HS to the external environment by providing a large surface area for conduction of heat from the first body of high thermal conductivity material 114 and/or the conductive melted high thermal conductivity material layer 116. When vibrations are applied to the heat sink 100, the plurality of tubes 124 will also vibrate, generating turbulence and mixing effects in the first body of high thermal conductivity material 114 and thereby aiding in heat transfer.

In embodiments where the at least one high thermal conductivity material selected for the first body of high thermal conductivity material 114 is a solid phase change material, it may be desirable to avoid applying the oscillating waves until a sufficient portion of the first body of high thermal conductivity material 114 has melted. In this embodiment, the thermally conductive housing 112 may also have at least one sensor 150 attached to the at least one wall 132 of the thermally conductive housing 112 and the at least one sensor 150 may be positioned to detect melting of the first body of high thermal conductivity material 114 at the direct contact interface 128 (See FIG. 2B). In this embodiment, the at least one sensor 150 may communicate with the vibrating base 120, such that the vibrating base 120 does not apply oscillating waves until the at least one sensor 150 detects melting of a sufficient quantity of the first body of high thermal conductivity material 114 to protect the heat source HS from being damaged by the resulting vibrations. For the avoidance of doubt, in all embodiments the vibrating base 120 will not vibrate unless a sufficient quantity of the first body of high thermal conductivity material 114 surrounding the heat source HS is liquid, to protect the heat source HS from being damaged by the resulting vibrations.

Figure 3A:
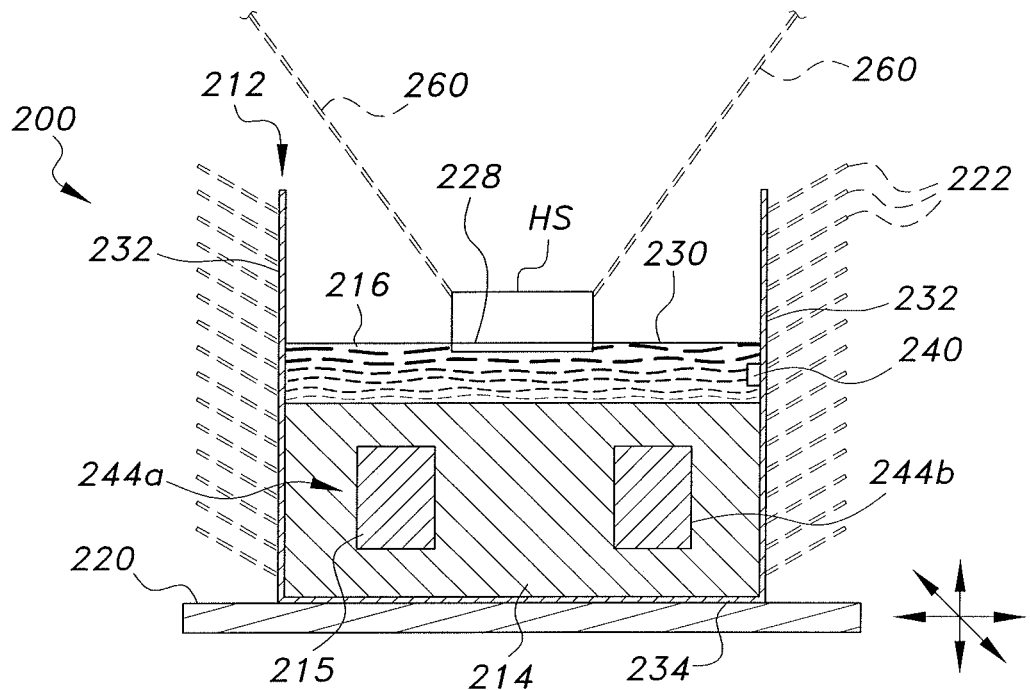
FIG. 3A is a side view in section of an alternative embodiment of a heat sink with vibration enhanced heat transfer for non-liquid heat sources having at least one internal chamber for a high thermal conductivity material.
Figure 3B:
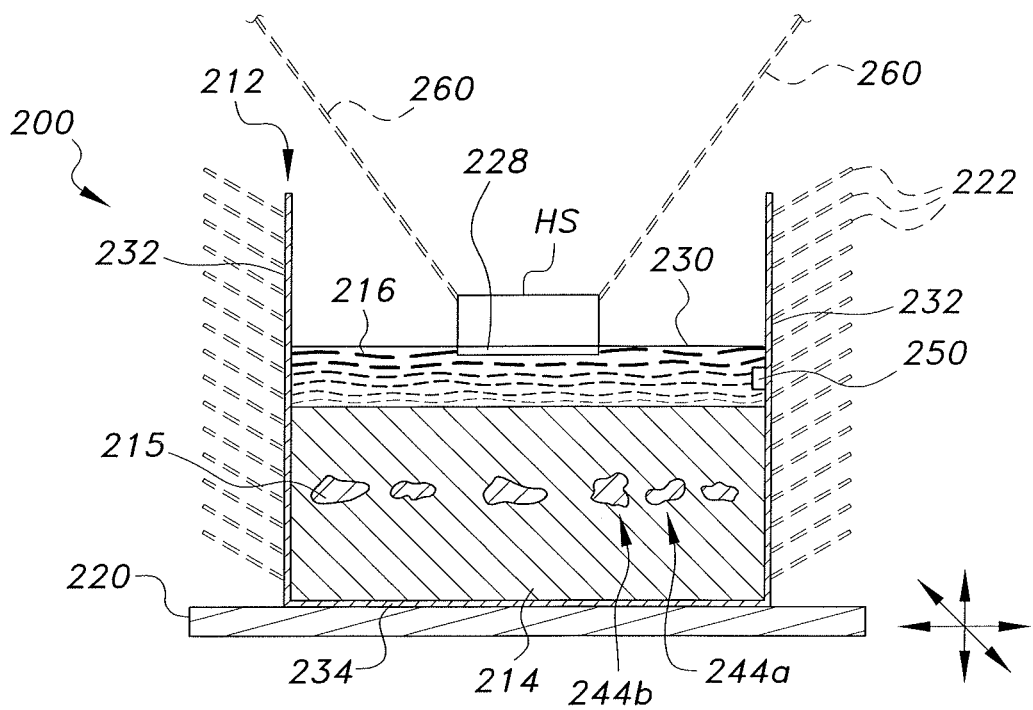
FIG. 3B is a side view in section of an alternative embodiment of a heat sink with vibration enhanced heat transfer for non-liquid heat sources having at least one internal chamber for a high thermal conductivity material.

In the alternative embodiment of FIGS. 3A and 3B, the heat sink with vibration enhanced heat transfer, designated generally as 200, is a heat sink formed from a first body of high thermal conductivity material 214 disposed within a thermally conductive housing 212 such that at least one contact face 230 of the first body of high thermal conductivity material 214 is exposed, forming a direct contact interface 228 with at least one face of at least one heat source HS that requires cooling. The thermally conductive housing 212 has at least one wall 232 and at least one contact face 234, and said contact face 234 of said thermally conductive housing 212 is adapted to be in direct contact with a vibrating base 220. In this embodiment, the at least one heat source HS may be any solid component that requires cooling. In some embodiments, the component that requires cooling can be a processor chip, an integrated circuit chip, a modular circuit package or the like. In this embodiment, the heat source HS may be physically attached to one or more supports 260. In some embodiments, the one or more supports 260 may be attached to at least one of the at least one wall 232, or the vibrating base 220 (not shown). In other embodiments, the one or more supports 260 may avoid any direct contact with the at least one wall 232, or the vibrating base 220 (as shown in FIGS. 3A and 3B). It should be further understood that the overall configuration and relative dimensions of the thermally conductive housing 212, the first body of high thermal conductivity material 214, the vibrating base 220, and the one or more supports 260 are shown for purposes of illustration only.

In the alternative embodiment of FIGS. 3A and 3B, at least one inner chamber 244 is disposed within the first body of high thermal conductivity material 214. The at least one inner chamber 244 may be regularly shaped as shown in FIG. 3A, or irregularly shaped as shown in FIG. 3B. The at least one inner chamber 244 is adapted to receive a second body of high thermal conductivity material 215. Said second body of high thermal conductivity material 215 may have a high thermal storage capacity, which may store latent thermal energy, sensible thermal energy, or both. In an embodiment, the at least one inner chamber 244 may be formed directly as a space in the first body of high thermal conductivity material 214.

The thermally conductive housing 212 may be selected from any suitable material that is compatible with the selected first body of high thermal conductivity material 214. For example, aluminum would not be used as a thermally conductive housing 212 material when the first body of high thermal conductivity material 214 includes elemental gallium. The at least one wall 232 of the thermally conductive housing 212 may have a plurality of fins 222 mounted to at least a portion thereof, outside of the first body of high thermal conductivity material 214. It should be understood that the positioning, overall configuration, relative dimensions, and number of thermally conductive fins 222 are shown for exemplary purposes only.

The first body of high thermal conductivity material 214 may comprise at least one high thermal conductivity material that may be liquid at intended operating conditions, or it may be a first solid phase change material. The at least one high thermal conductivity material being selected such that it has a high thermal conductivity and, if the high thermal conductivity material selected is a solid phase change material, is selected such that it has a melting point between the temperature of the external environment within which the heat sink 200 is intended to operate, and the maximum operating temperature of the heat source HS. If the at least one high thermal conductivity material selected for the first body of high thermal conductivity material 214 is a phase change material, it may further be selected to have a phase change temperature at the target temperature or within the target operating temperature range to which the heat source HS is intended to be cooled. As a non-limiting example, if the heat sink 200 is intended to operate in a room maintained at 20° C. and to cool a heat source with a maximum operating temperature of 60° C., elemental gallium having a melting point of approximately 30° C. might be selected for the first body of high thermal conductivity material 214. Non-limiting examples of suitable high thermal conductivity materials for the first body of high thermal conductivity material 214 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, pentadecanoic acid liquid gallium, and nano-fluids with high thermal conductivity nanoparticles.

The second body of high thermal conductivity material 215 may be formed from at least one second solid phase change material, the at least one second solid phase change material being selected such that it has a higher specific heat capacity than the specific heat capacity of the first body of high thermal conductivity material 214 and, if the first body of high thermal conductivity material 214 is a first solid phase change material, is selected such that it has a lower phase change temperature than the phase change temperature of the first body of high thermal conductivity material 214. Whether the first body of high thermal conductivity material 214 is formed from a liquid material or a phase change material, the second body of high thermal conductivity material 215 may be formed from a material selected such that in operation, the second body of high thermal conductivity material 215 maintains a lower temperature than the first body of high thermal conductivity material 214. Non-limiting examples of suitable solid phase change materials for the second body of high thermal conductivity material 215 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid. In an alternative embodiment, the second body of high thermal conductivity material 215 may be formed from encapsulated phase change material particles suspended in relevant high conductivity liquids.

In use, heat generated by the heat source HS is transferred by conduction into the first body of high thermal conductivity material 214. In the embodiments where the high thermal conductivity material is a solid phase change material, this may result in melting of at least a portion of the first body of high thermal conductivity material 214, which absorbs some of the heat from the heat source and forms a conductive melted high thermal conductivity material layer 216 within the first body of high thermal conductivity material 214 and disposed in direct contact with the heat source HS (as shown in FIGS. 3A and 3B). Therefore, the conductive melted high thermal conductivity material layer 216 is typically a partially liquid form of the first body of high thermal conductivity material 214. In embodiments where the high thermal conductivity material is a liquid, the first body of high thermal conductivity material 214 is immediately adjacent to the heat source HS.

The heat stored in the first body of high thermal conductivity material 214 and the heat stored in the conductive melted high thermal conductivity material layer 216, if present, may then be transferred by conduction and convection, respectively, to the thermally conductive housing 212. Heat transferred to the thermally conductive housing 212 may then be transferred by convection into the external environment, and by convection through the fins 222, if present, thereby cooling the heat sink 200. The vibrating base 220 may propagate oscillating waves through the thermally conductive housing 212, the first body of high thermal conductivity material 214, the second body of high thermal conductivity material 215, and/or the thermally conductive melted high thermal conductivity material layer 216, if present, to reach the direct contact interface 228, thereby increasing the rate of heat transfer from the heat source HS to the first body of phase change material 214 and the conductive melted high thermal conductivity material layer 216, if present. Thus the heat from the heat source HS is quickly and efficiently transferred to the ambient environment.

In embodiments where the at least one high thermal conductivity material selected for the first body of high thermal conductivity material 214 is a solid phase change material, it may be desirable to avoid applying the oscillating waves until a sufficient portion of the first body of high thermal conductivity material 214 has melted. In these embodiment, the thermally conductive housing 212 may also have at least one sensor 250 attached to the at least one wall 32 of the thermally conductive housing 212 and the at least one sensor 250 may be positioned to detect melting of the first body of high thermal conductivity material 214 at the direct contact interface 228 (See FIG. 3B). In this embodiment, the at least one sensor 250 may communicate with the vibrating base 220, such that the vibrating base 220 does not apply oscillating waves until the at least one sensor 250 detects melting of a sufficient quantity of the first body of high thermal conductivity material 214 to protect the heat source HS from being damaged by the resulting vibrations. For the avoidance of doubt, in all embodiments the vibrating base 220 will not vibrate unless a sufficient quantity of the first body of high thermal conductivity material 214 surrounding the heat source HS is liquid, to protect the heat source HS from being damaged by the resulting vibrations.

Figure 4A:
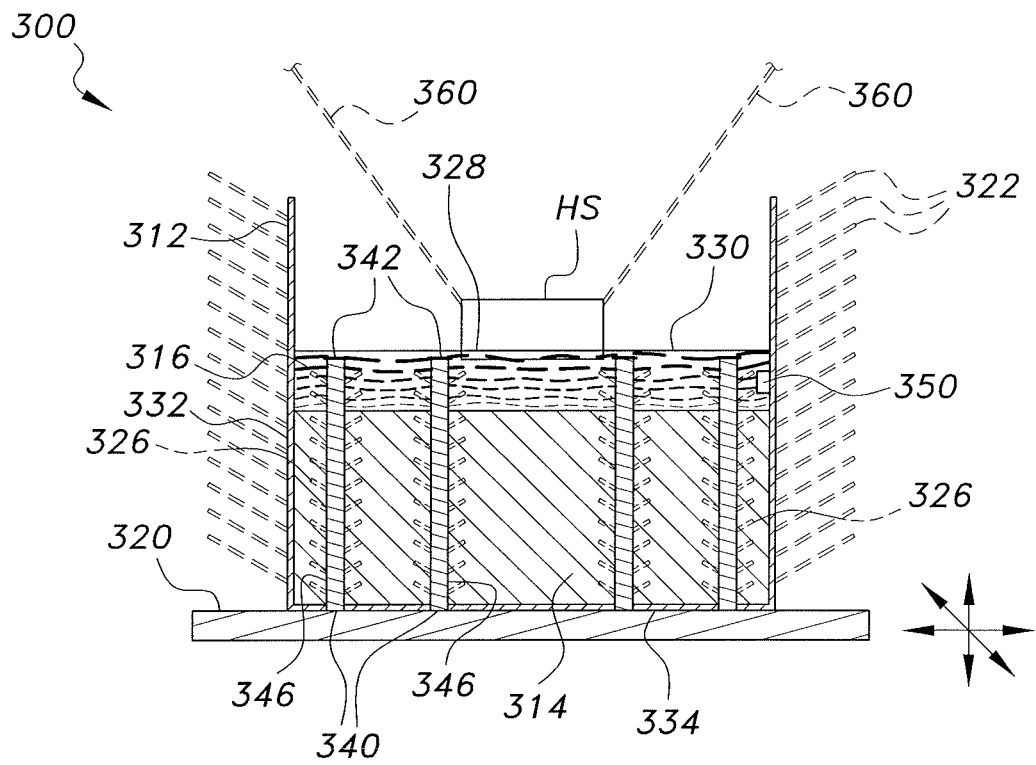
FIG. 4A is a side view in section of an alternative embodiment of a heat sink with vibration enhanced heat transfer for non-liquid heat sources having at least one thermally conductive vertical stud and a conductive melted high thermal conductivity material layer.
Figure 4B:
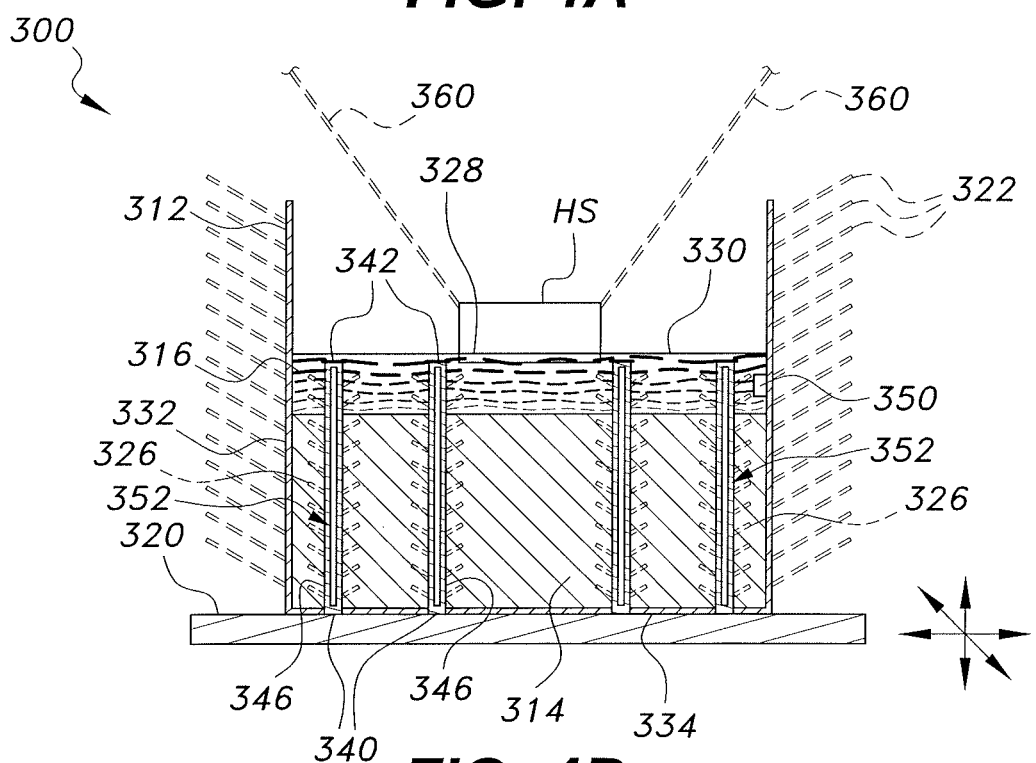
FIG. 4B is a side view in section of an alternative embodiment of a heat sink with vibration enhanced heat transfer for non-liquid heat sources having at least one thermally conductive vertical stud, which may have external rigid or flexible fins, and a conductive melted high thermal conductivity material layer, wherein the at least one thermally conductive vertical stud has at least one internal chamber containing a second body of high thermal conductivity material; wherein the second body of high thermal conductivity material is also a high thermal energy storage material.

In the alternative embodiment of FIGS. 4A and 4B, the heat sink with vibration enhanced heat transfer, designated generally as 300, is again a heat sink formed from a first body of high thermal conductivity material 314 disposed within a thermally conductive housing 312 such that at least one contact face 330 of the first body of high thermal conductivity material 314 is exposed, forming a direct contact interface 328 with at least one face of at least one heat source HS that requires cooling. Similar to previous embodiments, the thermally conductive housing 312 has at least one wall 332 and at least one contact face 334, and said contact face 334 of said thermally conductive housing 312 is adapted to be in direct contact with a vibrating base 320. In this embodiment, the at least one heat source HS may be any solid component that requires cooling. In some embodiments, the component that requires cooling can be a processor chip, an integrated circuit chip, a modular circuit package or the like. In this embodiment, the heat source HS may be physically attached to one or more supports 360. In some embodiments, the one or more supports 360 may be attached to at least one of the at least one wall 332, or the vibrating base 320 (not shown). In other embodiments, the one or more supports 360 may avoid any direct contact with the at least one wall 332, or the vibrating base 320 (as shown in FIGS. 4A and 4B). Similar to the previous embodiments, it should be further understood that the overall configuration and relative dimensions of the thermally conductive housing 312, the first body of high thermal conductivity material 314, the vibrating base 320, and the one or more supports 360 are shown for purposes of illustration only.

As in previous embodiments, the thermally conductive housing 312 may be selected from any suitable material that is compatible with the selected first body of high thermal conductivity material 314. For example, aluminum would not be used as a thermally conductive housing 312 material when the first body of high thermal conductivity material 314 includes elemental gallium.

In the alternative embodiment of FIGS. 4A and 4B, at least one thermally conductive vertical stud 346, having a first end 340 and a second end 342, is positioned within the first body of high thermal conductivity material 314. The first end 340 of the at least one thermally conductive vertical stud 346 may be coterminous with the at least one contact face 334 of the thermally conductive housing 312. Thus, the first end 340 of the at least one thermally conductive vertical stud 346 may be in direct contact with the vibrating base, 320. In an alternative embodiment, the first end 340 of the at least one thermally conductive vertical stud 346 may be in direct contact with the at least one contact face 334 of the thermally conductive housing 312. In this embodiment the first end 340 of the at least one thermally conductive vertical stud 346 is not in direct contact with the vibrating base 320. The second end 342 of the at least one thermally conductive vertical stud 346 is positioned within the first body of high thermal conductivity material 314 but below the heat source HS, such that the at least one thermally conductive vertical stud 346 cannot come into direct contact with the heat source HS. This will prevent the at least one thermally conductive vertical stud 346 from damaging the heat source HS or the one or more supports 360. Thus, the at least one thermally conductive vertical stud 346 may be oriented at any angle starting from the vibrating base 320 and rising towards the heat source HS. The at least one thermally conductive vertical stud 346 may be made of rigid material or of a non-rigid material. The surface of the at least one thermally conductive vertical stud 346 may be made from a malleable conducting material. Fins 326 may be attached to the surface of one or more of the thermally conductive vertical studs 346. The fins 326 may be rigid or flexible. In an embodiment where the fins 326 are flexible, they may vibrate at their own pace upon application of vibration to the heat sink 300, further agitating the first body of high thermal conductivity material 314 and thereby aiding the heat transfer from the heat source HS to the various heat sink 300 components, and subsequently to the external environment. Further, the surface of the one or more thermally conductive vertical studs 346 may bear irregularities such as grooves, bends, or other shapes to intensify heat transfer.

The at least on high thermal conductivity material may be liquid at intended operating conditions, or it may be a solid phase change material. The at least one phase change material being selected such that it has a high thermal conductivity and, if the high thermal conductivity material selected is a solid phase change material, is selected such that it has a melting point between the temperature of the external environment within which the heat sink 300 is intended to operate and the maximum operating temperature of the heat source HS. If the at least one high thermal conductivity material selected for the first body of high thermal conductivity material 314 is a phase change material, it may further be selected to have a phase change temperature at the target temperature or within the target operating temperature range to which the heat source HS is intended to be cooled. As a non-limiting example, if a heat sink 300 is intended to operate in a room maintained at 20° C. and to cool a heat source with a maximum operating temperature of 60° C., elemental gallium having a melting point of approximately 30° C. might be selected for the first body of high thermal conductivity material 314. Non-limiting examples of suitable high thermal conductivity materials for the first body of high thermal conductivity material 314 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, pentadecanoic acid liquid gallium, and nano-fluids with high thermal conductivity nanoparticles.

As in previous embodiments, in use, heat generated by the heat source HS is transferred by conduction, into the first body of high thermal conductivity material 314. In the embodiments where the high thermal conductivity material is a solid phase change material, this may result in melting of at least a portion of the first body of high thermal conductivity material 314, which absorbs some of the heat from the heat source HS and forms a conductive melted high thermal conductivity material layer 316 within the first body of high thermal conductivity material 314 and disposed in direct contact with the heat source HS. Therefore, the conductive melted high thermal conductivity material layer 316 is typically a partially liquid form of the first body of high thermal conductivity material 314 (as shown in FIGS. 4A and 4B). In embodiments where the high thermal conductivity material is a liquid, the first body of high thermal conductivity material 314 is immediately adjacent to the heat source (not shown).

The heat stored in the first body of high thermal conductivity material 314 and the heat stored in the conductive melted high thermal conductivity material layer 316, if present, may then be transferred by conduction and convection, respectively, to the thermally conductive housing 312. Heat transferred to the thermally conductive housing 312 may then be transferred by convection into the external environment, and by convection through the fins 322, if present, thereby cooling the heat sink 300. The vibrating base 320 may propagate oscillating waves through the thermally conductive housing 312, the first body of high thermal conductivity material 314, the at least one thermally conductive vertical stud 346, and/or the thermally conductive melted high thermal conductivity material layer 316, if present, to reach the direct contact interface 328, thereby increasing the rate of heat transfer from the heat source HS to the first body of phase change material 314 and the conductive melted high thermal conductivity material layer 316, if present.

In the alternative embodiment of FIGS. 4A and 4B, the at least one thermally conductive vertical stud 346 may by constructed of a rigid material, and thus the at least one thermally conductive vertical stud 346 may also vibrate, leading to further disturbance of the direct contact interface 328 and further enhancing the rate of heat transfer from the head source HS to the first body of phase change material 314 and the conductive melted high thermal conductivity material layer 316, if present. In the alternative embodiment of FIGS. 4A and 4B, the at least one thermally conductive vertical stud 346 may be made of a flexible, non-rigid material, and thus the at least one thermally conductive vertical stud 346 may move at a different rate in response to vibration than the thermally conductive housing 312. In the alternative embodiment of FIGS. 4A and 4B, the at least one thermally conductive vertical stud 346 may be constructed of a high thermal conductivity material, or a low thermal conductivity material, or a non-conducting material. If more than one thermally conductive vertical stud 346 is present, each may be made of the same or different material. If the at least one thermally conductive vertical stud 346 is constructed of a high thermal conductivity material, this stud may assist in conducting heat from the surrounding first body of high thermal conductivity material 314 directly to the vibrating base 320. If the at least one thermally conductive vertical stud 346 is constructed of a high thermal conductivity material, low-conducting or a non-conducting material, the at least one thermally conductive vertical stud 346 will agitate the surrounding first body of high thermal conductivity material 314 in response to vibration, assisting with heat transfer. Thus the heat from the heat source HS is quickly and efficiently transferred to the ambient environment.

In embodiments where the at least one high thermal conductivity material selected for the first body of high thermal conductivity material 314 is a solid phase change material, it may be desirable to avoid applying the oscillating waves until a sufficient portion of the first body of high thermal conductivity material 314 has melted. In this embodiment, the thermally conductive housing 312 may also have at least one sensor 350 attached to the at least one wall 332 of the thermally conductive housing 312 and the at least one sensor 350 may be positioned to detect melting of the first body of high thermal conductivity material 314 at the direct contact interface 328 (See FIG. 4). In this embodiment, the at least one sensor 50 may communicate with the vibrating base 320, such that the vibrating base 320 does not apply oscillating waves until the at least one sensor 350 detects melting of a sufficient quantity of the first body of high thermal conductivity material 314 to protect the heat source HS from being damaged by the resulting vibrations. For the avoidance of doubt, in all embodiments the vibrating base 320 will not vibrate unless a sufficient quantity of the first body of high thermal conductivity material 314 surrounding the heat source HS is liquid, to protect the heat source HS from being damaged by the resulting vibrations.

In the alternative embodiment of FIG. 4B, at least one internal chamber 352 is disposed within the at least one thermally conductive vertical stud 346. It should be further understood that the overall configuration and relative dimensions of the at least one inner chamber 352 are shown for illustration purposes only, and the at least one internal chamber 352 may be regularly shaped or irregularly shaped. The at least one internal chamber 352 is adapted to receive a body of high thermal storage capacity material. In an embodiment, the at least one internal chamber 352 may be formed directly as a space completely enclosed within the at least one thermally conductive vertical stud 346. The body of high thermal storage capacity material may comprise one or more phase change materials selected for changing phase at a lower temperature than the anticipated operating temperature of the heat source HS, or the phase change temperature of the first body of high thermal conductivity material 314, if the first body of high thermal conductivity material 314 is intended to operate as a phase change material. In the alternative embodiment of FIG. 4B, the at least one thermally conductive vertical stud 346 may comprise a high conductivity material, to aid in heat transfer from the heat source to the phase change material disposed within the at least one internal chamber 352. Non-limiting examples of suitable high thermal storage capacity material that can be used within the at least one internal chamber 352 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, pentadecanoic acid, liquid gallium, and nano-fluids.

In the alternative embodiment of FIG. 4B, heat transferred to the at least one thermally conductive vertical stud 346 may be transferred to the body of high thermal storage capacity material within the at least one internal chamber 352. Thus, if the high thermal storage capacity material is a phase change material, the body of high thermal storage capacity material may change phase, providing an internal reservoir for heat storage and allowing the heat sink to more efficiently cool the heat source HS. In this embodiment, heat stored in the body of high thermal storage capacity material within the at least one internal chamber 352 may be transferred to the at least one thermally conductive vertical stud 346, from there directly to the colder vibrating base 320 and from there to the surrounding external environment. Thus, this embodiment further increases the efficiency of heat capture by the heat sink 300, and increases the efficiency by which the heat source HS is cooled.

Figure 5:
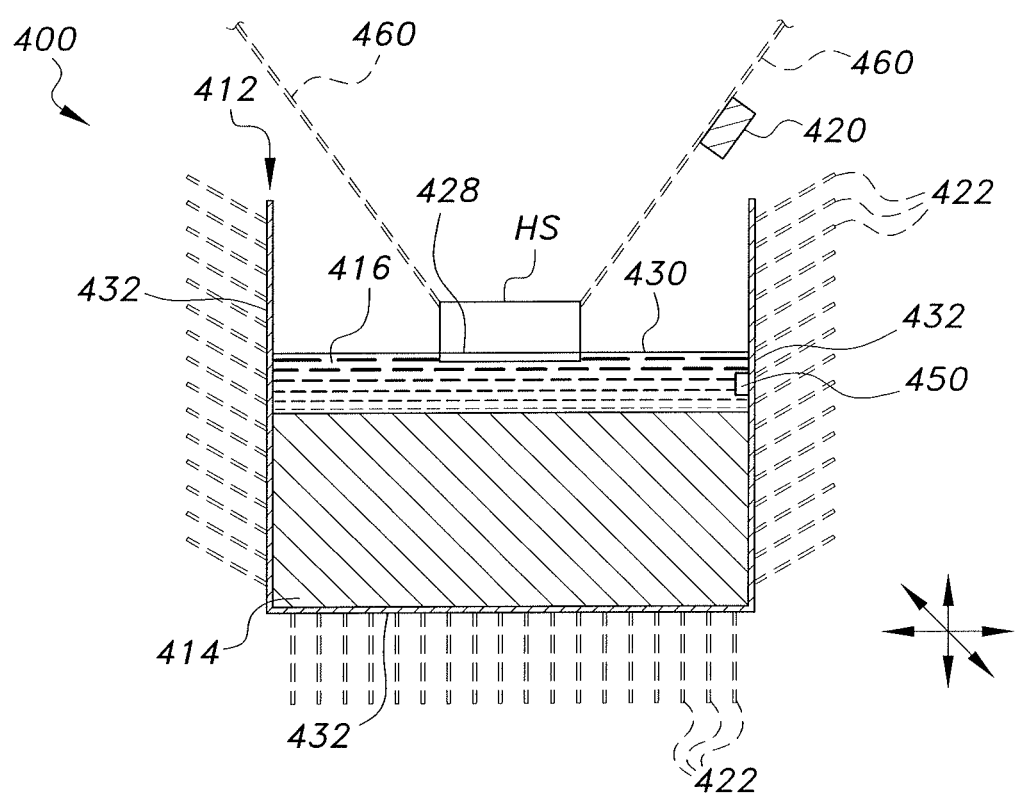
FIG. 5 is a side view in section of an alternative embodiment of a heat sink with vibration enhanced heat transfer for non-liquid heat sources having at least one vibrating base attached to one or more of the at least one supports, thereby transmitting the vibrations through the heat source and into the conductive melted high thermal conductivity material layer.

Referring to the embodiment of FIG. 5, the heat sink with vibration enhanced heat transfer, designated generally as 400, is a heat sink formed from a first body of high thermal conductivity material 414 disposed within a thermally conductive housing 412 such that at least one contact face 430 of the first body of high thermal conductivity material 414 is exposed, forming a direct contact interface 428 with at least one face of at least one heat source HS that requires cooling. The thermally conductive housing 412 has at least one wall 432. In this embodiment, the at least one heat source HS may be any solid component that requires cooling. In some embodiments, the component that requires cooling can be a processor chip, an integrated circuit chip, a modular circuit package or the like. In this embodiment, the heat source HS may be physically attached to one or more supports 460 and said supports 460 may be adapted to be in direct contact with at least one vibrating base 420. In some embodiments, the one or more supports 460 may be attached to at least one of the at least one wall 432. In other embodiments, the one or more supports 460 may avoid any direct contact with the at least one wall 432 (as shown in FIG. 5). It should be further understood that the overall configuration and relative dimensions of the thermally conductive housing 412, the first body of high thermal conductivity material 414, the at least one vibrating base 420, and the one or more supports 460 are shown for purposes of illustration only.

The thermally conductive housing 412 may be selected from any suitable material that is compatible with the selected first body of high thermal conductivity material 414. For example, aluminum would not be used as a thermally conductive housing 412 material when the first body of high thermal conductivity material 414 includes elemental gallium. The at least one wall 432 of the thermally conductive housing 412 may have a plurality of fins 422 mounted to at least a portion thereof, outside of the first body of high thermal conductivity material 414. It should be understood that the positioning, overall configuration, relative dimensions, and number of thermally conductive fins 422 are shown for exemplary purposes only.

The first body of high thermal conductivity material 414 may comprise at least one high thermal conductivity material that may be liquid at intended operating conditions, or it may be a solid phase change material. The at least one high thermal conductivity material is selected such that it has a high thermal conductivity and, if the high thermal conductivity material selected is a solid phase change material, is selected such that it has a melting point between the temperature of the external environment within which the heat sink 400 is intended to operate, and the maximum operating temperature of the heat source HS. If the at least one high thermal conductivity material selected for the first body of high thermal conductivity material 414 is a phase change material, it may further be selected to have a phase change temperature at the target temperature or within the target operating temperature range to which the heat source HS is intended to be cooled. As a non-limiting example, if a heat sink 400 is intended to operate in a room maintained at 20° C. and to cool a heat source with a maximum operating temperature of 60° C., elemental gallium having a melting point of approximately 30° C. might be selected for the first body of high thermal conductivity material 414. Non-limiting examples of suitable high thermal conductivity materials for the first body of high thermal conductivity material 414 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, pentadecanoic acid, liquid gallium, and nano-fluids with high thermal conductivity nanoparticles.

In use, heat generated by the heat source HS is transferred, via conduction, into the first body of high thermal conductivity material 414. In the embodiments where the high thermal conductivity material is a solid phase change material, this may result in melting of at least a portion of the first body of high thermal conductivity material 414, which absorbs some of the heat from the heat source and forms a conductive melted high thermal conductivity material layer 416 within the first body of high thermal conductivity material 414 and disposed in direct contact with the heat source HS (as shown in FIG. 5). Therefore, the conductive melted high thermal conductivity material layer 416 is typically a partially liquid form of the first body of high thermal conductivity material 414. In embodiments where the high thermal conductivity material is a liquid, the first body of high thermal conductivity material 414 is immediately adjacent to the heat source HS (not shown).

The heat stored in the first body of high thermal conductivity material 414 and the heat stored in the conductive melted high thermal conductivity material layer 416, if present, may then be transferred by conduction and convection, respectively, to the thermally conductive housing 412. Heat transferred to the thermally conductive housing 412 may then be transferred by convection into the external environment, and by convection through the fins 422, if present, thereby cooling the heat sink 400. The vibrating base 420 may propagate oscillating waves through the supports 460 into the heat source HS, and from there into the first body of high thermal conductivity material 414 and/or the thermally conductive melted high thermal conductivity material layer 416, if present, to reach the direct contact interface 428, thereby increasing the rate of heat transfer from the heat source HS to the first body of high thermal conductivity material 414 and the thermally conductive melted high thermal conductivity material layer 416, if present. Thus the heat from the heat source HS is quickly and efficiently transferred to the ambient environment.

In embodiments where the at least one high thermal conductivity material selected for the first body of high thermal conductivity material 414 is a solid phase change material, it may be desirable to avoid applying the oscillating waves until a sufficient portion of the first body of high thermal conductivity material 414 has melted. In this embodiment, the thermally conductive housing 412 may also have at least one sensor 450 attached to the at least one wall 432 of the thermally conductive housing 412 and the at least one sensor 450 may be positioned to detect melting of the first body of high thermal conductivity material 414 at the direct contact interface 428 (See FIG. 5). In this embodiment, the at least one sensor 450 may communicate with the vibrating base 420, such that the vibrating base 420 does not apply oscillating waves until the at least one sensor 450 detects melting of a sufficient quantity of the first body of high thermal conductivity material 414 to protect the heat source HS from being damaged by the resulting vibrations. For the avoidance of doubt, in all embodiments the vibrating base 420 will not vibrate unless a sufficient quantity of the first body of high thermal conductivity material 414 surrounding the heat source HS is liquid, to protect the heat source HS from being damaged by the resulting vibrations.

Features of each of the disclosed embodiments may be used in other of the disclosed embodiments. For example, the tube of the embodiment of FIG. 2A can be used in the embodiment of FIG. 3A, and so on.

It is to be understood that the heat sinks with vibration enhanced heat transfer for non-liquid heat sources are not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A heat sink with vibration enhanced heat transfer for non-liquid heat sources, comprising:
    a thermally conductive housing having at least one contact face and at least one wall;
    a first body made of a thermally conductive phase change material disposed within thermally conductive housing, the first body of thermal conductivity material having a first contact face disposed for direct contact with a non-liquid heat source to be cooled at one end of the housing and a second contact face located at a first contact face of the housing; and
    a vibrating base, the vibrating base disposed in direct contact with an entire second contact face of the thermally conductive housing; wherein the vibrating base is configured to propagate oscillating waves through the thermally conductive housing and the second contact face of the first body of thermal conductivity material to reach the first contact face disposed for direct contact with the non-liquid heat source; and
    at least one thermally conductive vertical stud having opposed first and second ends, wherein the first end of the thermally conductive vertical stud is affixed within the second contact face of the thermally conductive housing and the first end of the vertical stud is in direct contact with the vibrating base and the second end is positioned within the first body.

2. The heat sink as recited in claim 1, further comprising a plurality of thermally conductive fins mounted on at least a portion of the at least one wall of the thermally conductive housing.

3. The heat sink as recited in claim 1, further comprising at least one internal chamber within the at least one thermally conductive vertical stud, and a body of high thermal storage capacity material within the at least one internal chamber.

4. The heat sink as recited in claim 1, further comprising a plurality of fins mounted on at least a portion of the at least one thermally conductive vertical stud.

5. The heat sink as recited in claim 1, wherein the first body of thermal conductivity material is a solid phase change material.

6. The heat sink as recited in claim 5, further comprising at least one sensor positioned on the thermally conductive housing to detect melting of the first body of thermal conductivity material at the contact face adapted for direct contact with the non-liquid heat source to be cooled.

7. The heat sink as recited in claim 1, wherein the first body of thermal conductivity material is a liquid.

\* \* \* \* \*